United States Patent
Söderberg et al.

(10) Patent No.: US 6,383,624 B1
(45) Date of Patent: *May 7, 2002

(54) PVD $AL_2O_3$ COATED CUTTING TOOL

(75) Inventors: Staffan Söderberg; Peter Littecke, both of Huddinge (SE)

(73) Assignee: Sandvik AB, Sandviken (SE)

( * ) Notice: Subject to any disclaimer, the term of this patent is extended or adjusted under 35 U.S.C. 154(b) by 0 days.

This patent is subject to a terminal disclaimer.

(21) Appl. No.: 09/563,835

(22) Filed: May 4, 2000

(30) Foreign Application Priority Data

May 6, 1999 (SE) .............................................. 9901648

(51) Int. Cl.$^7$ .............................................. C23C 14/06
(52) U.S. Cl. ........................... 428/325; 51/307; 51/309; 425/216; 425/336; 425/472; 425/698; 425/701; 425/702
(58) Field of Search ................................. 428/325, 701, 428/702, 698, 336, 216, 472; 57/307, 309

(56) References Cited

U.S. PATENT DOCUMENTS

| 5,503,913 A | 4/1996 | König et al. |
| 5,516,588 A | 5/1996 | van den Berg et al. |
| 5,639,285 A | 6/1997 | Yao et al. |
| 5,674,564 A | 10/1997 | Ljungberg et al. |
| 5,861,210 A | 1/1999 | Lenander et al. |
| 5,879,823 A | 3/1999 | Prizzi et al. |
| 6,090,476 A | * 7/2000 | Thysell et al. .............. 428/216 |
| 6,210,726 B1 | * 4/2001 | Schiller et al. ............. 428/216 |

FOREIGN PATENT DOCUMENTS

| EP | 744473 | 4/1996 |
| WO | 9828464 | 7/1998 |
| WO | 9924634 | 5/1999 |

OTHER PUBLICATIONS

O. Zywitzki et al., "Effect of the substrate temperature on the structure and properties of $Al_2O_3$ layers reactively deposited by pulsed magnetron sputtering", Surface and Coatings Technology 82 (1996) pp. 169–175.

* cited by examiner

*Primary Examiner*—Archene Turner
(74) *Attorney, Agent, or Firm*—Burns, Doane, Swecker & Mathis, L.L.P.

(57) ABSTRACT

The present invention describes a coated CBN cutting tool for metal machining. The tool consists of one or more CBN substrate bodies with or without carbide backing. The coating is composed of one or more layers of refractory compounds of at least one layer of fine-grained, crystalline γ-phase alumina ($Al_2O_3$) with a grainsize less than 0.1 $\mu$m. The $Al_2O_3$-layer is deposited with a bipolar pulsed DMS technique (Dual Magnetron Sputtering) at substrate temperatures in the range 450° C. to 700° C.

16 Claims, No Drawings

PVD AL$_2$O$_3$ COATED CUTTING TOOL

FIELD OF THE INVENTION

The present invention relates to a cutting tool for metal machining, comprising at least one body containing CBN, (polycrystalline cubic boron nitride), with or without carbide backing, and a hard and wear resistant refractory coating on the surface of said body. The coating is adherently bonded to the body and covers all functional parts thereof. The coating is composed of one or more layers of refractory compounds of which at least one layer consists of fine-crystalline γ-Al$_2$O$_3$, deposited by Physical Vapour Deposition (PVD).

BACKGROUND OF THE INVENTION

Cutting tools having cutting edges formed of a superhard abrasive such as a cubic boron nitride (CBN) based material are manufactured by powder metallurgical techniques and are mainly used for the machining of cast iron and hardened steel. Several types of CBN cutting tools are known, the majority consisting of a CBN tip that has been brazed onto a carbide insert. Others have the CBN sintered directly to a carbide backing of sufficient thickness to produce an insert while yet others consist of a CBN-containing body without any carbide backing.

Subjecting a sintered CBN body to temperatures over 1000° C. may result in unwanted structural changes in the material. Furthermore, in the case of a brazed insert the braze joint will be destroyed.

Swedish patent application 9704066-1 discloses a coated cutting tool for metal machining. The coating is composed of one or more layers of refractory compounds of which at least one layer consists of fine-grained, crystalline γ-phase alumina (Al$_2$O$_3$) with a grainsize less than 0.1 μm. The Al$_2$O$_3$-layer is deposited with a bipolar pulsed DMS technique (Dual Magnetron Sputtering) at substrate temperatures in the range 450° C. to 700° C.

WO 98/28464 discloses that by applying a coating including a MTCVD-TiCN and a CVD-Al$_2$O$_3$-layer to such a CBN tool material, substantial advantages in tool life can be achieved when machining hardened ball bearing steel.

U.S. Pat. No. 5,503,913 proposes improving the wear properties of tools with a cutting edge of cubic boron nitride or polycrystalline cubic boron nitride to coat the superhard body with a 0.5–6 μm thick coating of one or more oxides of the metals Zr, Y, Mg, Ti or Al. The coating is deposited from the gas phase at temperatures up to 800° C., preferably using a pulse plasma CVD-process.

SUMMARY OF THE PRESENT INVENTION

According to one aspect of the present invention, there is provided a cutting tool comprising a substrate and a coating, said substrate comprising a body containing at least 35 vol-% cubic boron nitride, and said coating comprising at least one layer of alumina, said alumina layer consisting essentially of γ-Al$_2$O$_3$ with a grain size less than 0.1 μm and being free from halogen impurities.

According to another aspect of the present invention, there is provided a method of making a cutting tool, the cutting tool comprising a substrate and a refractory layer of fine-grained crystalline γ-Al$_2$O$_3$, the method comprising the steps of: (i) heating the substrate to a temperature of 450–700° C.; and (ii) depositing the γ-Al$_2$O$_3$ onto the substrate by reactive pulsed magnetron sputtering in a gas mixture of argon and oxygen at a pressure of 1–5 μbar, wherein the pulse frequency is 10–100 kHz, the coating is deposited at a rate of at least 1 nm/s, and the magnetron power density in time average is set for at least 10 W/cm$^2$.

DETAILED DESCRIPTION OF PREFERRED EMBODIMENTS

According to the present invention a cutting tool comprising at least one body containing at least 35 vol-% cubic boron nitride, CBN, provided with a hard and wear resistant refractory coating.

The hard and wear resistant coating is composed of one or more layers of refractory compounds of which at least one layer, preferably the outermost layer, consists essentially of γ-Al$_2$O$_3$ deposited thereon by the DMS PVD method at substrate temperatures of 450 to 700° C., preferably 550 to 650° C. The γ-Al$_2$O$_3$-layer consists of high-quality, dense, fine-grained crystalline Al$_2$O$_3$ with a grain size less than 0.1 μm. Furthermore, the γ-Al$_2$O$_3$-layers are virtually free of cracks and halogen impurities with a hardness of at least 20 GPa and a compressive stress of at least 1 GPa.

The inner layer(s), if any at all, between the tool body and the Al$_2$O$_3$-layer, is composed of metal nitrides, carbonitrides and/or carbides with the metal elements selected from Ti, Nb, Hf, V, Ta, Mo, Zr, Cr, W and Al. In a first embodiment the PcBN material according to the invention contains more than 70% cBN by volume. This material is particularly useful for the machining of cast iron.

In a second embodiment the PcBN-material contains less than 70% cBN by volume the remainder being other hard wear resistant constituents such as carbides, nitrides, carbonitrides, oxides or borides of the metals of groups IVa to VIa of the periodic table, usually TiC, TiN or Ti(C,N). An example of such a material is disclosed in U.S. Pat. No. 5,639,285. This kind of PcBN-material is mainly used in cutting tools for machining of hardened steel.

Often, the PcBN material also contains smaller amounts (typically <10 wt % each) of other components, e.g. Co, Ni, WC, Al, AlN and Al$_2$O$_3$.

In a third embodiment a PCBN cutting tool is manufactured without carbide backing or support. Usually such a product contains more than 80 % cBN by volume.

In a fourth embodiment, the PcBN cutting tool contains a cBN-containing material attached to a substrate, preferably a cemented carbide substrate, by brazing, sintering or in any other way. The cemented carbide is WC-Co with 10–20, preferably 15–17, wt-% Co.

The γ-Al$_2$O$_3$-layers according to the invention further give the cutting edges of the tool an extremely smooth surface finish which also results in an improved surface finish of the work piece being machined. The very smooth surface finish can be attributed to the very fine crystallinity of the coating. The "γ-Al$_2$O$_3$"-layers may also partially contain other phases from the "γ-series" like θ, δ and η. Identification of the γ- and/or θ-phases in the Al$_2$O$_3$-layers according to the invention can preferably be made by X-ray diffraction. Reflexes from the (400) and (440) planes of the γ-Al$_2$O$_3$-layers occurring at the 2θ-angles 45.80 and 66.80 when using Cu$_{K\alpha}$ radiation, unequivocally identify the γ-phase. Weaker reflexes from the (222), (200) and (311) planes of the γ-phase can occasionally be identified. When the theta-phase is present in the Al$_2$O$_3$-layers according to the invention, said phase is identified by the reflexes from the (200, 20-2) planes.

The fine-grained, crystalline γ-Al$_2$O$_3$ according to the invention is strongly textured in the [440]-direction. A Texture Coefficient, TC, can be defined as.

$$TC(hkl) = \frac{I(hkl)}{I_0(hkl)} \left\{ \frac{1}{n} \sum \frac{I(hkl)}{I_0(hkl)} \right\}^{-1}$$

where

I(hkl)=measured intensity of the (hkl) reflection $I_O(hkl)$=standard intensity from the ASTM standard powder pattern diffraction data n=number of reflections used in the calculation (hkl) reflections used are: (111), (311), (222), (400) and (440) and whenever the TC(hkl)>1, there is a texture in the [hkl]-direction. The larger the value of TC(hkl), the more pronounced the texture. According to the present invention, the TC for the set of (440) crystal planes is greater than 1.5.

A further improvement in cutting performance can be anticipated if the edges of the γ-$Al_2O_3$ coated cutting tools according to the invention are treated by a gentle wet-blasting process or by edge brushing with brushes based on, for example, SiC as disclosed in U.S. Pat. No. 5,861,210.

The total coating thickness according to the present invention varies between 0.5 and 20μm, preferably between 1 and 15μm. The thickness of the non-$Al_2O_3$-layer(s) varies between 0.1 and 10 μm, preferably between 0.5 and 15 μm. The fine-grained γ-$Al_2O_3$-coating can also be deposited directly onto the CBN cutting tool and the thickness of said γ-$Al_2O_3$ varies then between 0.5 and 15 μm preferably between 1 and 10 μm. Likewise further coatings of metal nitrides, carbonitrides and/or carbides with the metal elements selected from Ti, Nb, Hf, V, Ta, Mo, Zr, Cr, W and Al can be deposited on top of the $Al_2O_3$-layer, preferably TiN.

The fine-grained crystalline γ-$Al_2O_3$-layer according to the invention is deposited by a bipolar dual magnetron sputtering technique onto a moving substrate in vacuum. The substrate may be floating or pulsed biased, the exact condition depending to a certain extent on the design of the equipment being used.

The $Al_2O_3$-layer is deposited by a reactive, pulsed magnetron sputtering in a gas mixture of argon and oxygen at a pressure of 1–5 μbar. The pulse frequency is 10 to 100 kHz, preferably 50 kHz. Deposition occurs with a rate of at least 1 nm/s with reference to a stationary arranged substrate. The magnetron target power density in time average is at least 10 W/cm$^2$ and the substrate temperature is 450 to 700° C., preferably 550 to 650° C.

Preferably the $Al_2O_3$-layer is deposited by the sputtering of two magnetrons with Al targets that are alternatively switched as a cathode and as an anode of a magnetron sputtering apparatus.

It is within the purview of the skilled artisan to determine whether the requisite grain size and phase compositions have been obtained and to modify the deposition conditions in accordance with the present specification, if desired, to affect the nanostructure of the $Al_2O_3$-layer within the frame of the invention.

The layer(s) described in the present invention, comprising metal nitrides and/or carbides and/or carbonitrides and with the metal elements selected from Ti, Nb, Hf, V, Ta, Mo, Zr, Cr, W and Al can be deposited by PVD-technique, CVD-and/or MTCVD-technique (Medium Temperature Chemical Vapor Deposition) particularly by pulsed magnetron sputtering.

The principles, preferred embodiments and mode of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

We claim:

1. A cutting tool comprising a substrate and a coating said substrate comprising a body containing at least 35 vol-% cubic boron nitride; and said coating comprising at least one layer of alumina, said alumina layer consisting essentially of γ-$Al_2O_3$ with a grain size less than 0.1 μm and being free from halogen impurities.

2. The cutting tool of claim 1, wherein the γ-$Al_2O_3$ layer exhibits significant X-ray diffraction reflexes from at least one of the (440) and (400) crystal planes, said at least one layer having a hardness of at least 20 GPa and a compressive stress of at least 1 GPa.

3. The cutting tool of claim 1, wherein the $Al_2O_3$-layer has a preferred growth orientation in the [440]-direction with a texture coefficient greater than 1.5 defined as:

$$TC(hkl) = \frac{I(hkl)}{I_O(hkl)} \left\{ \frac{1}{n} \sum \frac{I(hkl)}{I_O(hkl)} \right\}^{-1}$$

where

I(hkl)=measured intensity of the (hkl) reflection $I_O(hkl)$=standard intensity from the ASTM standard powder pattern diffraction data n=number of reflections used in the calculation (hkl) reflections used are: (111), (311), (222), (400) and (440).

4. The cutting tool of claim 1, wherein the fine grained crystalline γ-$Al_2O_3$-layer contains portions of additional alumina phases from the γ-series of the $Al_2O_3$-polymorphs.

5. The cutting tool of claim 4, wherein the $Al_2O_3$ polymorphs comprise a θ-phase.

6. The cutting tool of claim 1, wherein the coating further comprises at least one layer of thickness 0.1–10 μm, comprising metal nitrides, carbonitrides and/or carbides with the metal elements selected from Ti, Nb, Hf, V, Ta, Mo, Zr, Cr, W and Al.

7. The cutting tool of claim 6, wherein the at least one layer of metal nitrides and/or carbides has a thickness of 0.5–5 μm and the nitrides and/or carbides are selected from TiC, TiCN, TiN, and TiAlN.

8. The cutting tool of claim 1, wherein the outer layer is $Al_2O_3$.

9. The cutting tool of claim 1, wherein the outer layer is TiN.

10. The cutting tool of claim 1, wherein the substrate contains more than 80% cBN by volume.

11. The cutting tool of claim 1, wherein the substrate contains 35–90% CBN by volume, the remainder being other hard wear resistant constituents comprising at least one of: carbides, nitrides, carbonitrides, oxides or borides of the metals of groups IVa to VIa of the periodic table, TiC, TiN, or Ti(C,N).

12. The cutting tool of claim 1, wherein said tool is formed entirely of the cBN-containing material.

13. The cutting tool of claim 1, wherein said tool is formed from the cBN-containing material attached to a substrate.

14. The cutting tool of claim 13, wherein the substrate comprises cemented carbide and the CBN material is attached to the substrate by brazing or sintering.

15. The cutting tool of claim 14, wherein the cemented carbide is WC-Co with 10–20 wt-% Co.

16. The cutting tool of claim 15, wherein the cemented carbide comprises 15–17 wt-% Co.

* * * * *